United States Patent
Pearlstein

(10) Patent No.: US 11,282,710 B2
(45) Date of Patent: Mar. 22, 2022

(54) SELECTIVE DEPOSITION ON SILICON CONTAINING SURFACES

(71) Applicant: Versum Materials US, LLC, Tempe, AZ (US)

(72) Inventor: Ronald Martin Pearlstein, San Marcos, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/548,983

(22) Filed: Aug. 23, 2019

(65) Prior Publication Data

US 2020/0066539 A1   Feb. 27, 2020

Related U.S. Application Data

(60) Provisional application No. 62/723,023, filed on Aug. 27, 2018.

(51) Int. Cl.

| | | |
|---|---|---|
| *H01L 21/02* | (2006.01) | |
| *H01L 21/3105* | (2006.01) | |
| *C23C 16/455* | (2006.01) | |
| *C23C 16/02* | (2006.01) | |
| *C23C 16/34* | (2006.01) | |

(52) U.S. Cl.
CPC ...... *H01L 21/3105* (2013.01); *C23C 16/0245* (2013.01); *C23C 16/345* (2013.01); *C23C 16/45553* (2013.01); *H01L 21/0206* (2013.01)

(58) Field of Classification Search
CPC ............ H01L 21/3105; H01L 21/02219
See application file for complete search history.

(56) References Cited

U.S. PATENT DOCUMENTS

| | | | | |
|---|---|---|---|---|
| 10,519,035 | B1 * | 12/2019 | Dwyer | H01L 21/02258 |
| 2002/0119279 | A1 * | 8/2002 | Ogawa | G11B 7/252 |
| | | | | 428/64.4 |
| 2016/0126384 | A1 * | 5/2016 | Van Aert | C09D 133/14 |
| | | | | 136/251 |
| 2018/0374975 | A1 * | 12/2018 | Ayon | H01L 31/02167 |
| 2020/0119077 | A1 * | 4/2020 | Koga | H01L 27/14607 |
| 2020/0330931 | A1 * | 10/2020 | Carter | B01D 71/46 |

FOREIGN PATENT DOCUMENTS

| | | | | |
|---|---|---|---|---|
| JP | 61087699 | A | * | 5/1986 |
| JP | 3592226 | B2 | * | 11/2004 |
| JP | 2013011465 | A | * | 1/2013 |

OTHER PUBLICATIONS

Liu, Li-Hong, et al., "Surface etching, chemical modification and characterization of silicon nitride and silicon oxide-selective functionalization of Si3N4 and SiO2", J. Phys.: Condens. Matter 28 (2016) 094014 (doi: 10.1088/0953-8984/28/9/094014), pp. 1-20.

* cited by examiner

*Primary Examiner* — Michele Fan
(74) *Attorney, Agent, or Firm* — Daniel A. DeMarah, Jr.

(57) ABSTRACT

A method for selectively passivating a surface of a substrate, wherein the surface of the substrate includes at least a first surface comprising silicon nitride and at least a second surface comprising a material other than silicon nitride. The method includes the step of exposing the surface to at least one organoisocyanate wherein the organoisocyanate selectively reacts with the silicon nitride to passivate the first surface thereby leaving the second surface substantially unreacted.

34 Claims, No Drawings

SELECTIVE DEPOSITION ON SILICON CONTAINING SURFACES

CROSS-REFERENCE TO RELATED APPLICATIONS

This application claims priority to U.S. provisional application 62/723,023 filed on Aug. 27, 2018, the entire contents of which is incorporated herein by reference thereto for all allowable purposes.

BACKGROUND

The present application relates to selective deposition on a first surface of a substrate relative to a second surface. In addition, further processing can be used to subsequently deposit a different material on the second surface relative to the first.

Selective deposition processes are gaining a lot of momentum mostly because of the limitations of contemporary lithographic processes to enable the fabrication of advanced semiconductor devices based on ever diminishing physical dimensions. Traditionally, patterning in the microelectronics industry has been accomplished using various lithography and etch processes. However, since lithography is becoming exponentially more complex and expensive the use of selective deposition to form self-aligned features is becoming much more attractive. The fabrication of self-aligned via structures would benefit significantly from manufacturable selective deposition processes. Another potential application for selective deposition is gap fill. In gap fill, the dielectric "fill" film is grown selectively from the bottom of a trench towards the top. Selective deposition could be used for other applications such as selective sidewall deposition where films are selectively deposited on exposed surfaces of three dimensional FIN-FET structures. This would enable the deposition of a sidewall spacer without the need for complex patterning steps. Selective deposition processes for metal and metal oxide films that are used as gate dielectrics and capacitor dielectrics would also be of great utility in semiconductor device manufacturing.

There are many previous examples within the technical literature related to the selective formation of surface passivation coatings on wafers with multiple, different chemical surfaces that are exposed. This has been done with the purpose of retarding or preventing the deposition of films through ALD processes on these passivated surfaces, but not preventing deposition on the surfaces where the ALD deposition process is desired to deposit a film. In general, the selectivity of the processes has been less than adequate due to incomplete passivation of the surfaces and/or due to physisorption of ALD precursor molecules and subsequent formation of the ALD film material either within the passivation layer itself or on the surfaces where deposition is not desired. The present invention seeks to overcome the limitations of the prior art and provide improved methods for selective deposition of thin film materials using ALD deposition processes.

Liu, L. -H. et al. J. Phys.: Condens. Matter 28 (2016) 094014 (doi:10.1088/0953-8984/28/9/094014) teach that silicon nitride might be selectively passivated to some extent relative to silicon oxide by treatment of a treated surface with a solution containing an aldehyde.

SUMMARY

In one aspect, provided herein is a method for selectively passivating the surface of a substrate by vapor phase reaction, wherein the surface of the substrate comprises at least a first surface comprising silicon nitride and at least a second surface comprising a material other than the silicon nitride, the method comprising the steps of: a. contacting the surface of the substrate with a wet chemical composition; b. rinsing the surface with deionized water; c. drying the surface; d. optionally, treating the surface with hydrogen plasma or ammonia plasma; and e. exposing the surface to a vapor comprising at least one organoisocyanate having a structure according to Formula I: R—N=C=O (I), wherein, R is selected from the group consisting of H, a substituted or unsubstituted $C_1$ to $C_{18}$ linear alkyl group, a substituted or unsubstituted branched $C_3$ to $C_{18}$ alkyl group, a substituted or unsubstituted $C_3$ to $C_8$ cyclic alkyl group, a substituted or unsubstituted $C_3$ to $C_{10}$ heterocyclic group, a substituted or unsubstituted $C_3$ to $C_{18}$ alkenyl group, a substituted or unsubstituted $C_4$ to $C_{18}$ aryl group, a substituted or unsubstituted $C_5$ to $C_{20}$ arylalkyl group, and a substituted or unsubstituted $C_3$ to $C_{10}$ alkynyl group, wherein the at least one organoisocyanate selectively reacts with the silicon nitride to passivate the first surface thereby leaving the second surface substantially unreacted.

In another aspect, provided herein is a method of selectively depositing a film on a surface of a substrate wherein the surface of the substrate comprises at least a first surface comprising silicon nitride and at least a second surface comprising a material other than the silicon nitride, the method comprising the steps of: a. contacting the surface of the substrate with a wet chemical composition; b. rinsing the surface with deionized water; c. drying the surface; d. optionally, treating the surface with hydrogen plasma or ammonia plasma; e. exposing the surface to a vapor comprising at least one organoisocyanate having a structure according to Formula I: R—N=C=O (I), wherein, R is selected from the group consisting of H, a substituted or unsubstituted $C_1$ to $C_{18}$ linear alkyl group, a substituted or unsubstituted branched $C_3$ to $C_{18}$ alkyl group, a substituted or unsubstituted $C_3$ to $C_8$ cyclic alkyl group, a substituted or unsubstituted $C_3$ to $C_{10}$ heterocyclic group, a substituted or unsubstituted $C_3$ to $C_{18}$ alkenyl group, a substituted or unsubstituted $C_4$ to $C_{18}$ aryl group, a substituted or unsubstituted $C_5$ to $C_{20}$ arylalkyl group, and a substituted or unsubstituted $C_3$ to $C_{10}$ alkynyl group, wherein the at least one organoisocyanate selectively reacts with the silicon nitride to passivate the first surface thereby leaving the second surface substantially unreacted; and f. exposing the surface of the substrate to one or more deposition precursors to deposit a film on the second surface selectively over the first surface.

The embodiments of the invention can be used alone or in combinations with each other.

DETAILED DESCRIPTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

There are a variety of methods that could be used for selective depositions. Embodiments of the disclosure are directed to methods that employ surface deactivation by taking advantage of the surface chemistry of two different surfaces. Since two different surfaces will have different reactive handles, the differences can be taken advantage of by utilizing molecules that will react with one surface (to deactivate that surface) and not react with the other surface.

In one embodiment, there is provided a method for selectively passivating a surface of a substrate by vapor phase reaction, wherein the surface of the substrate comprises at least a first surface comprising silicon nitride and at least a second surface comprising a material other than the silicon nitride, the method comprising the steps of: a. contacting the surface of the substrate with a wet chemical composition; b. rinsing the surface with deionized water; c. drying the surface; d. optionally, treating the surface with hydrogen plasma or ammonia plasma; and e. exposing the surface to a vapor comprising at least one organoisocyanate having a structure according to Formula I: R—N═C═O (I), wherein, R is selected from the group consisting of H, a substituted or unsubstituted $C_1$ to $C_{18}$ linear alkyl group, a substituted or unsubstituted branched $C_3$ to $C_{18}$ alkyl group, a substituted or unsubstituted $C_3$ to $C_8$ cyclic alkyl group, a substituted or unsubstituted $C_3$ to $C_{10}$ heterocyclic group, a substituted or unsubstituted $C_3$ to $C_{18}$ alkenyl group, a substituted or unsubstituted $C_4$ to $C_{18}$ aryl group, a substituted or unsubstituted $C_5$ to $C_{20}$ arylalkyl group, and a substituted or unsubstituted $C_3$ to $C_{10}$ alkynyl group, wherein the at least one organoisocyanate selectively reacts with the silicon nitride to passivate the first surface thereby leaving the second surface substantially unreacted.

In another embodiment, there is provided a method of selectively depositing a film on a surface of a substrate wherein the surface of the substrate comprises at least a first surface comprising silicon nitride and at least a second surface comprising a material other than the silicon nitride, the method comprising the steps of: a. contacting the surface of the substrate with a wet chemical composition; b. rinsing the surface with deionized water; c. drying the surface; d. optionally, treating the surface with hydrogen plasma or ammonia plasma; e. exposing the surface to a vapor comprising at least one organoisocyanate having a structure according to Formula I: R—N═C═O (I), wherein, R is selected from the group consisting of H, a substituted or unsubstituted $C_1$ to $C_{18}$ linear alkyl group, a substituted or unsubstituted branched $C_3$ to $C_{18}$ alkyl group, a substituted or unsubstituted $C_3$ to $C_8$ cyclic alkyl group, a substituted or unsubstituted $C_3$ to $C_{10}$ heterocyclic group, a substituted or unsubstituted $C_3$ to $C_{18}$ alkenyl group, a substituted or unsubstituted $C_4$ to $C_{18}$ aryl group, a substituted or unsubstituted $C_5$ to $C_{20}$ arylalkyl group, and a substituted or unsubstituted $C_3$ to $C_{10}$ alkynyl group, wherein the at least one organoisocyanate selectively reacts with the silicon nitride to passivate the first surface thereby leaving the second surface substantially unreacted; and f. exposing the substrate to one or more deposition precursors to deposit a film on the second surface selectively over the first surface.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used. In one or more embodiments, the first substrate surface will comprise a metal, and the second substrate surface will comprise a dielectric, or vice versa. In some embodiments, a substrate surface may comprise certain functionality (e.g., —OH, —NH, etc.).

Likewise, the films that can be used in the methods described herein are quite varied. In some embodiments, the films may comprise, or consist essentially of, a metal. Examples of metal films include, but are not limited to, cobalt (Co), copper (Cu), nickel (Ni), tungsten (W), etc. In some embodiments, the film comprises a dielectric. Examples include, $SiO_2$, SiN, $HfO_2$, etc.

In embodiments of the present invention, the substrate has at least two discrete surfaces wherein each discrete surface is characterized by a different chemistry. For example, in an embodiment, the surface of the substrate comprises at least a first surface comprising silicon nitride and at least a second surface comprising a material other than silicon nitride.

The at least one second surface comprising a material other than silicon nitride can be, for example, any of the materials selected from the group consisting of $SiO_2$, a metal oxide, copper, cobalt, tungsten, amorphous silicon, polysilicon, monocrystalline silicon, germanium, and amorphous hydrogenated germanium. In some embodiments the at least one second surface comprises $SiO_2$ is a dielectric surface, such as a $SiO_2$ surface. In some embodiments the surface comprising $SiO_2$ may comprise silicon oxides, fluorinated silica glass (FSG), carbon doped silicon oxide (SiOC) and/or materials containing more than about 50% silicon oxide. In some embodiments the surface comprising $SiO_2$ comprises —OH groups and may also comprise, for example, an alumina ($Al_2O_3$) surface with —OH surface groups.

Embodiments of the disclosure provide methods of selectively depositing a film such as, for example, a metal film, onto one surface of a substrate over a second surface on the same substrate. As used in this specification and the appended claims, the term "selectively depositing a film on one surface over another surface," and the like, means that one of the first or second surface is passivated to substantially prevent deposition on the passivated layer and a film is deposited on the second (non-passivated) surface. The term "over" used in this regard does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some situations it is desirable to selectively deposit a material on one surface of a substrate relative to a second, different surface of the same substrate. For example, selective deposition may be used to form capping layers, barrier layers, etch stop layers, sacrificial and/or protective layers or for sealing pores, such as in porous low k materials.

The method of the present invention includes the optional step of contacting the surface of the substrate with a wet chemical composition to obtain a treated substrate. Exemplary wet chemical treatments include known chemical treatments such as, for example, RCA clean chemicals SC-1 and SC-2, aqueous HF, peroxide, $H_2SO_4/H_2O_2$, $NH_4OH$, buffered HF solutions, and mixtures thereof.

In preferred embodiments, the wet chemical composition comprises at least one selected from the group consisting of a composition comprising $H_2O_2$ (28% aq), $NH_4O_4$ (28-30%), and $H_2O$; HF (0.01%-10% (aq)); peroxide; RCA clean chemicals SC-1 and SC-2; and a mixture of $H_2SO_4/H_2O_2$.

As is known in the art, "RCA clean chemicals" refer to compositions comprising an ammonium hydroxide and hydrogen peroxide mixture wherein the basic cleaning procedure developed by the Radio Corporation of America in the 1960s. The RCA Standard-Clean-1 (SC-1) procedure uses an ammonium hydroxide and hydrogen peroxide solution and water heated to a temperature of about 70° C. The SC-1 procedure dissolves films and removes Group I and II metals. The Group I and II metals are removed through complexing with the reagents in the SC-1 solution. The RCA Standard-Clean-2 (SC-2) procedure utilizes a mixture of hydrogen peroxide, hydrochloric acid, and water heated to a temperature of about 70° C. The SC-2 procedure removes the metals that are not removed by the SC-1 procedure.

Contacting with the wet chemical composition can occur by any method known to those skilled in the art such as, for example, dipping or spraying. The contacting step can be one discrete step or more than one step.

In some embodiments, the temperature of the wet chemical composition during the contacting step can be, for example, from about ambient temperature to about 100° C. In other embodiments, the temperature of the wet chemical composition during the contacting step can be, for example, from about 55° C. to about 95° C. In other embodiments, the temperature of the wet chemical composition during the contacting step can be, for example, from about 60° C. to about 90° C.

Embodiments also include the step of rinsing the surface of the substrate with deionized water after the step of contacting the surface of the substrate with the wet chemical composition. The rinsing step is typically carried out by any suitable means, for example, rinsing the surface of the substrate with de-ionized water by immersion or spray techniques.

Embodiments also include the step of drying at least the surface of the substrate after the rinsing step. The drying step is typically carried out by any suitable means, for example, the application of heat, isopropyl alcohol (IPA) vapor drying, or by centripetal force.

Embodiments also optionally include the step of treating the surface with hydrogen plasma or ammonia plasma. Suitable processes include plasma processes (hydrogen plasma, $NH_3/NF_3$ plasmas, water plasmas, and the like). The optional plasma step functions to remove undesired deposits on the surface and activate the surface for subsequent deposition of passivation reagents. Such plasma treatments may be most preferably applied after some deposition on the surface has been performed in order to remove non-selectively deposited material from the previously passivated surface and to remove residual passivation reagents after the desired deposition thickness has been achieved.

Embodiments include the step of exposing the surface to a vapor comprising at least one organoisocyanate having a structure according to Formula I:

$$R-N=C=O \qquad (I),$$

wherein, R is selected from the group consisting of H, a substituted or unsubstituted $C_1$ to $C_{18}$ linear alkyl group, a substituted or unsubstituted branched $C_3$ to $C_{18}$ alkyl group, a substituted or unsubstituted $C_3$ to $C_8$ cyclic alkyl group, a substituted or unsubstituted $C_3$ to $C_{10}$ heterocyclic group, a substituted or unsubstituted $C_3$ to $C_{18}$ alkenyl group, a substituted or unsubstituted $C_4$ to $C_{18}$ aryl group, a substituted or unsubstituted $C_5$ to $C_{20}$ arylalkyl group, and a substituted or unsubstituted $C_3$ to $C_{10}$ alkynyl group, wherein the at least one organoisocyanate selectively reacts with the silicon nitride to passivate the first surface thereby leaving the second surface substantially unreacted.

In some embodiments, the organoisocyanate is a fluorine-substituted $C_1$ to $C_{18}$ linear alkyl group having a structure selected from the group consisting of $C_nF_{2n+1}CH_2N=C=O$ and $C_nF_{2n+1}(C_2H_4)N=C=O$. Preferred organoisocyanate precursors having a fluorine-substituted $C_1$ to $C_{18}$ linear alkyl group having a structure $C_nF_{2n+1}CH_2N=C=O$ include those selected from the group consisting of $CF_3CH_2N=C=O$, $C_2F_5CH_2N=C=O$, $C_3F_7CH_2N=C=O$, $C_4F_9CH_2N=C=O$, $C_5F_{11}CH_2N=C=O$, $C_6F_{13}CH_2N=C=O$, $C_7F_{15}CH_2N=C=O$, $C_8F_{17}CH_2N=C=O$, and $C_9F_{19}CH_2N=C=O$.

In other embodiments, R in Formula I is a chlorine-substituted $C_1$ to $C_{18}$ linear alkyl group having a structure $C_nCl_{2n+1}CH_2N=C=O$. Preferred organoisocyanate precursors having a chlorine-substituted $C_1$ to $C_{18}$ linear alkyl group having a structure $C_nCl_{2n+1}CH_2N=C=O$ include those selected from the group consisting of $CCl_3CH_2N=C=O$, $C_2Cl_5CH_2N=C=O$, $C_3Cl_7CH_2N=C=O$, $C_4Cl_9CH_2N=C=O$, $C_5Cl_{11}CH_2N=C=O$, $C_6Cl_{13}CH_2N=C=O$, $C_7Cl_{15}CH_2N=C=O$, $C_8Cl_{17}CH_2N=C=O$, and $C_9Cl_{19}CH_2N=C=O$.

In other embodiments, R in Formula I is a substituted or unsubstituted $C_3$ to $C_8$ cyclic alkyl group. In such embodiments, the at least one organoisocyanate includes those selected from the group consisting of cyclopropyl isocyanate, cyclobutyl isocyanate, cyclohexyl isocyanate, and methylcyclohexyl isocyanate.

In other embodiments, R in Formula I is a substituted or unsubstituted $C_4$ to $C_{18}$ aryl group. In such embodiments, the organoisocyanate includes those selected from the group consisting of phenyl isocyanate, tolyl isocyanate, dimethylphenyl isocyanate, naphthyl isocyanate, 2-ethylphenylisocyanate, and xylyl isocyanate.

In other embodiments, R in Formula I is an unsubstituted $C_1$ to $C_{18}$ linear alkyl group or R is a substituted or unsubstituted branched $C_3$ to $C_{18}$ alkyl group. In such embodiments, the organoisocyanate includes those selected from the group consisting of methyl isocyanate, ethyl isocyanate, propyl isocyanate, isopropyl isocyanate, n-butyl isocyanate, sec-butyl isocyanate, tert-butyl isocyanate, pentyl isocyanate, hexyl isocyanate, octyl isocyanate, decyl isocyanate, dodecyl isocyanate, stearyl isocyanate, 1,1,3,3-tetramethylbutylisocyanate, and 1-methylheptylisocyanate.

In another embodiment, R in Formula I is a substituted or unsubstituted $C_{54}$ to $C_{20}$ arylalkyl group. In such embodiments, the organoisocyanate includes benzyl isocyanate.

As employed throughout the description, the term "alkyl" means a saturated hydrocarbon group which is straight-chained or branched. In some embodiments, the alkyl group has from 1 to 20 carbon atoms, from 2 to 20 carbon atoms, from 1 to 10 carbon atoms, from 2 to 10 carbon atoms, from 1 to 8 carbon atoms, from 2 to 8 carbon atoms, from 1 to 6 carbon atoms, from 2 to 6 carbon atoms, from 1 to 4 carbon atoms, from 2 to 4 carbon atoms, from 1 to 3 carbon atoms, or 2 or 3 carbon atoms. Examples of alkyl groups include, but are not limited to, methyl (Me), ethyl (Et), propyl (e.g., n-propyl and isopropyl), butyl (e.g., n-butyl, t-butyl, isobutyl), pentyl (e.g., n-pentyl, isopentyl, neopentyl), hexyl, isohexyl, heptyl, octyl, nonyl, 4,4-dimethylpentyl, 2,2,4-trimethylpentyl, decyl, undecyl, dodecyl, 2-methyl-1-propyl, 2-methyl-2-propyl, 2-methyl-1-butyl, 3-methyl-1-butyl, 2-methyl-3-butyl, 2-methyl-1-pentyl, 2,2-dimethyl-1-propyl, 3-methyl-1-pentyl, 4-methyl-1-pentyl, 2-methyl-2-pentyl, 3-methyl-2-pentyl, 4-methyl-2-pentyl, 2,2-dimethyl-1-butyl, 3,3-dimethyl-1-butyl, 2-ethyl-1-butyl, and the like.

As employed throughout the description, the term "cyclic alkyl" denotes a cyclic functional group having from 3 to 10 or from 4 to 10 carbon atoms. Exemplary cyclic alkyl groups include, but are not limited to, cyclobutyl, cyclopentyl, cyclohexyl, and cyclooctyl groups.

As used herein, the term "aryl" means a monocyclic, bicyclic, or polycyclic (e.g., having 2, 3 or 4 fused rings) aromatic hydrocarbon. In some embodiments, the aryl group has from 6 to 20 carbon atoms or from 6 to 10 carbon atoms. Examples of aryl groups include, but are not limited to, phenyl, naphthyl, anthracenyl, phenanthrenyl, indanyl, indenyl, and tetrahydronaphthyl, and the like.

As used herein, the term "arylalkyl" means an alkyl group substituted by an aryl. In some embodiments, the alkyl group is a $C_{1-6}$ alkyl group.

As employed throughout the description, the term "alkenyl group" denotes a group which has one or more carbon-carbon double bonds and has from 2 to 18 or from 2 to 10 carbon atoms. Exemplary alkenyl groups include, but are not limited to, vinyl or allyl groups.

As used herein, the term "alkynyl" means a straight or branched alkyl group having 2 to 20 carbon atoms and one or more triple carbon-carbon bonds. In some embodiments, the alkynyl group has from 2 to 10 carbon atoms, from 2 to 8 carbon atoms, from 2 to 6 carbon atoms, or from 2 to 4 carbon atoms. Examples of alkynyl groups include, but are not limited to, acetylene, 1-propylene, 2-propylene, and the like.

As used herein, the phrase "optionally substituted" means that a substitution is optional and, therefore, includes both unsubstituted and substituted atoms and moieties. A "substituted" atom or moiety indicates that any hydrogen atom on the designated compound or moiety can be replaced with a selection from the indicated substituent groups, provided that the normal valency of the designated compound or moiety is not exceeded, and that the substitution results in a stable compound. For example, if a methyl group is optionally substituted, then 1, 2, or 3 hydrogen atoms on the carbon atom within the methyl group can be replaced with 1, 2, or 3 of the recited substituent groups.

As used herein, the term "phenyl" means $-C_6H_5$. A phenyl group can be unsubstituted or substituted with one, two, or three suitable substituents.

As used herein, the term "cyclic alkyl" means non-aromatic cyclic hydrocarbons including cyclized alkyl, alkenyl, and alkynyl groups that have up to 20 ring-forming carbon atoms. Cycloalkyl groups have from 3 to 15 ring-forming carbon atoms, from 3 to 10 ring-forming carbon atoms, from 3 to 8 ring-forming carbon atoms, from 3 to 6 ring-forming carbon atoms, from 4 to 6 ring-forming carbon atoms, from 3 to 5 ring-forming carbon atoms, or 5 or 6 ring-forming carbon atoms. Ring-forming carbon atoms of a cycloalkyl group can be optionally substituted by oxo or sulfido. Cycloalkyl groups include, but are not limited to, monocyclic or polycyclic ring systems such as fused ring systems, bridged ring systems, and spiro ring systems. In some embodiments, polycyclic ring systems include 2, 3, or 4 fused rings. Examples of cycloalkyl groups include, but are not limited to, cyclopropyl, cyclobutyl, cyclopentyl, cyclohexyl, cycloheptyl, cyclooctyl, cyclononyl, cyclopentenyl, cyclohexenyl, cyclohexadienyl, cycloheptatrienyl, norbornyl, norpinyl, norcarnyl, adamantyl, and the like. Cycloalkyl groups can also have one or more aromatic rings fused (having a bond in common with) to the cycloalkyl ring such as, for example, benzo or thienyl derivatives of pentane, pentene, hexane, and the like (e.g., 2,3-dihydro-1H-indene-1-yl, or 1H-inden-2(3H)-one-1-yl).

As used herein, the term "halo" means halogen groups and includes, but is not limited to, fluoro, chloro, bromo, and iodo.

As used herein, the term "heterocycle" or "heterocyclic ring" means a 5- to 7-membered monocyclic or 7- to 10-membered bicyclic ring system, any ring of which may be saturated or unsaturated, and which ring consists of carbon atoms and from one to three heteroatoms chosen from N, O and S, and wherein the N and S heteroatoms may optionally be oxidized, and the N heteroatom may optionally be quaternized, and including any bicyclic group in which any of the above-defined heterocyclic rings is fused to a benzene ring. Heterocycles include rings containing one oxygen or sulfur, one to three nitrogen atoms, or one oxygen or sulfur combined with one or two nitrogen atoms. The heterocyclic ring may be attached at any heteroatom or carbon atom which results in the creation of a stable structure. Examples of heterocyclic groups include, but are not limited to, piperidinyl, piperazinyl, 2-oxopiperazinyl, 2-oxopiperidinyl, 2-oxopyrrolodinyl, 2-oxoazepinyl, azepinyl, pyrrolyl, 4-piperidonyl, pyrrolidinyl, pyrazolyl, pyrazolidinyl, imidazolyl, imidazolinyl, pyridyl, imidazolidinyl, pyrazinyl, pyrimidinyl, pyridazinyl, oxazolyl, oxazolidinyl, isoxazolyl, isoxazolidinyl, morpholinyl, thiazolyl, thiazolidinyl, isothiazolyl, quinuclidinyl, isothiazolidinyl, indolyl, quinolinyl, isoquinolinyl, benzimidazolyl, thiadiazoyl, benzopyranyl, benzothiazolyl, benzoxazolyl, furyl, tetrahydrofuryl, tetrahydropyranyl, thienyl, benzothienyl, thiamorpholinyl, thiamorpholinyl sulfoxide, thiamorpholinyl sulfone, oxadiazolyl, and the like.

Vapor phase or gas phase reactions include the exposure of the heated substrate to the precursor molecule(s) and/or co-reactants in a suitable chamber that must be capable of providing the necessary pressure control and that can also supply heat to the substrate and/or chamber walls; the chamber should also provide suitable purity for the reactions that will take place, generally through high leak integrity and the use of ultra-high purity carrier and reactive gases.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas. They may be used in conjunction with ultra-high purity carrier gases (as defined previously) and in any desired mixtures with one another (i.e. more than one type of precursor can be used either together or in discrete, independent steps to form the desired passivation layer with whatever order of precursor introduction is desired).

The precursor(s) and/or co-reactants may be delivered to the reactor using mass flow controllers (perhaps with heated lines), liquid injection vaporizors (perhaps with heated lines) or with no metering device (i.e. neat introduction of the vapor and or gas from a vessel that is isolated from the reactor using a simple valve). Any of the foregoing may also be used in combination with one another. Any means of providing the gas and/or vapor(s) to the reaction chamber that provides sufficient purity and repeatability may be used.

The precursor(s) and/or co-reactants may be introduced independently to the reactor, mixed prior to introduction to the reactor, mixed in the reactor or in any combination of the preceding in multiple, independent steps that might include differences in how the precursors are introduced between steps.

The temperature range of the reactions may be between room temperature and 400° C. In some cases, the temperature range of the reactions may be between room temperature and 200° C. In yet other cases, the temperature range of the reactions may be between room temperature and 100° C. The pressure may range from 10-10 Torr to 3000 Torr and may be maintained under dynamic flow conditions (i.e. with a valve and a butterfly valve type arrangement) or may be maintained under static conditions (i.e. an evacuated chamber is exposed to the desired precursor(s) and/or co-reactant(s) until a total desired pressure is achieved and then the chamber is isolated from both the precursor(s) and/or co-reactant(s) source(s) and the vacuum pump). The reactor can be evacuated fully and re-exposed to fresh precuror(s) and/or co-reactants as many times as necessary. Precursor(s) and/or co-reactants may be introduced using any mixtures and/or concentrations desired.

The exposure of the surface can be conducted for 0.1-60 minutes, preferably in 1-5 minutes and most preferably for 1 minute. The partial pressure of the isocyanate in the reaction chamber can vary from about 1% of its saturated vapor pressure at the substrate temperature up to almost 100% of its saturation vapor pressure. Most preferably, it will be between 20 and 50% of its saturation vapor pressure. The chamber pressure can be the same as the partial pressure of the isocyanate vapors but can be higher with the balance of the atmosphere comprising a carrier gas. Preferred carrier gases include $N_2$, He and Ar, but also other gases such as $H_2$, $CO_2$ and dry $O_2$ may be used. The exposure vapors can be static (not flowing) for all or part of the exposure period. The preferred embodiment is to flow the vapors of the isocyanate along with the optional carrier gas through the exposure chamber so that fresh vapors are exposed to the surface of the substrate for at least a portion of the exposure period.

The exposure chamber can be kept at near ambient temperature or can optionally be heated. Heat can be supplied to the outer walls of the chamber (hot wall) or only to the substrate (cold-wall reactor). Substrate heating in a cold wall reactor can be achieved by use of incident radiation through a transparent window (lamp heating), by resistive heating of the substrate itself or from resistive heating elements in the platform that the substrate is contacting, through induction or by other means known in the art. The temperature of the treatment is preferably between about 20° C. to about 400° C., preferably between 20° C. to about 200° C., and most preferably between 20° C. to about 100° C. The temperature can be constant during the exposure period or can vary within the specified temperature range.

Unreacted vapor of the at least one organoisocyanate can then optionally be removed by evacuation or purging of the chamber with suitable inert gas before removing the substrate from the chamber or before chemical vapor or atomic-layer deposition processing. Optionally, the exposure chamber might also be used for subsequent processing steps to improve process efficiency so that the process may be repeated from step c), if necessary, to strip the protective film and any non-selective ALD deposit and then re-form a protective film.

The choice of the at least one organoisocyanate and the exposing conditions used in this method should be optimized by standard experimentation to optimize selectivity of the protection afforded the silicon nitride surface against potential non-selective passivation, processing time, reagent cost, etc depending on the requirements imposed by subsequent processing steps. For example, selectivity can be adjusted/optimized by varying the nature of the R group of the at least one organoisocyanate having the structure represented by Formula I. Typically, since reactivity and selectivity are often inversely related, if the two surfaces are similar in chemistry, experimenting with the R group may be required to optimize the process. There is a difference in reactivity, for example between alkyl R-groups and aryl R-groups; typically arylisocyanides are more reactive with active hydrogen bearing surfaces compared to alkylisocyanide. As a result, in some cases the alkylisocyanide might be needed to selectively passivate the SiN without also passivating an adjacent surface that also has less reactive active hydrogen atoms.

Once the silicon nitride surface is passivated the second surface comprising, for example, silicon oxide, is active for further selective reactions such as, for example, a selective ALD deposition of SiCN on the Si—H surface. Additional materials that may be selectively deposited on the secon surface including silicon films comprising oxygen, nitrogen, hydrogen and carbon (i.e., $SiO_x$, $SiN_x$, $SiO_xN_y$, $SiC_xN_y$, $SiO_xC_y$, all possibly incorporating H as well), metals, metal nitrides, and metal oxides.

In some embodiments, a metal oxide film is selectively deposited on the second surface. In one example, the metal oxide film may serve as a cap layer on the second surface. The metal oxide film can, for example, be deposited by atomic layer deposition (ALD), plasma-enhanced ALD (PEALD), chemical vapor deposition (CVD), plasma-enhanced CVD (PECVD), or pulsed CVD. According to one embodiment, the metal oxide film may be selected from the group consisting of $HfO_2$, $ZrO_2$, $TiO_2$, $Al_2O_3$, and a combination thereof. In some examples, the metal oxide film may be deposited by ALD using alternating exposures of a metal organic precursor and an oxidizer (e.g., $H_2O$, $H_2O_2$, plasma-excited $O_2$ or $O_3$) as is detailed in U.S. provisional patent application Ser. No. 62/472,724, filed on Mar. 17, 2017, the entirety of which is incorporated herein by reference.

Selective depositions according to the present invention can be, for example, metal and metal oxide layers disclosed in Hamalainen et al., "Atomic Layer Deposition of Noble Metals and Their Oxides," Chem. Mater. 2014, 26, 786-801; and Johnson et al., "A Brief review of Atomic layer Deposition: From Fundamentals to Applications", Materials Today, Volume 17, Number 5, June 2014, both of which are incorporated herein by reference in their entireties.

In some embodiments, a metal film is selectively deposited on the second surface. In one example, the metal film may serve as a cap layer on the second surface. In another example, the metal film may serve as a conductive pathway on the second surface (i.e. a line, pad or plug). In another example the metal film can, for example, be deposited by atomic layer deposition (ALD), plasma-enhanced ALD (PEALD), chemical vapor deposition (CVD), plasma-enhanced CVD (PECVD), or pulsed CVD. According to one embodiment, the metal film may be selected from the group consisting of Al, Ti, Co, Rh, Ir, Fe, Ru, Os, Mn, Tc, Re, Cu, Ag, Au, Ni, Pd or Pt and a combination thereof.

In some embodiments, a metal or metal nitride film is selectively deposited on the second surface. In one example, the metal or metal nitride film may serve as a cap layer on the second surface. In another example, the metal or metal nitride film may serve as a diffusion barrier layer. The metal or metal nitride film can, for example, be deposited by atomic layer deposition (ALD), plasma-enhanced ALD (PEALD), chemical vapor deposition (CVD), plasma-enhanced CVD (PECVD), or pulsed CVD. Examples are found in, for example, "IBM Research Report, "Atomic Layer Deposition of Metal and Metal Nitride Thin Films: Current Research Efforts and Applications for Semiconductor Device Processing," RC22737 (W0303-012), Mar. 5, 2003.

During the selective deposition process, the aforementioned protective surface previously deposited selectively on silicon nitride surfaces with the at least one organoisocyanate could begin to react or otherwise become less inert. An optional re-application of the at least one organoisocyanate, either with or without any of the aqueous or plasma pre-treatment steps may optionally be performed repeatedly to prevent or delay non-selective deposition on the silicon nitride surface.

In some embodiments passivation on a first surface of a substrate as described herein, such a silicon nitride surface of the substrate, relative to a second surface of the substrate is at least about 90% selective, at least about 95% selective, at least about 96%, 97%, 98% or 99% or greater selective. In some embodiments passivation only occurs on the first surface and does not occur on the second surface. In some embodiments passivation on the first surface of the substrate relative to the second surface of the substrate is at least about 70% selective, or at least about 80% selective, which may be selective enough for some particular applications. In some embodiments passivation on the first surface of the substrate relative to the second surface of the substrate is at least about 50% selective, which may be selective enough for some particular applications.

Wet chemistry cleans may be used to remove the passivation layer. Example wet chemistry cleans include acidic, basic, and oxidative (e.g., peroxide-containing) wet chemistry compositions known in the art and described above for the optional step of contacting the substrate with a wet chemical composition. Another method to remove the passivation layer is via the application of heat or other energy.

Example 1: A 300 mm diameter silicon wafer (the substrate) having a patterned surface containing both silicon nitride and silicon oxide features was dipped into a bath containing aqueous 1% hydrofluoric acid solution (0.3 moles/L) for 60 seconds and then rinsed with de-aerated DI water and dried under nitrogen gas. The wafer was transferred into a deposition chamber that was evacuated and heated to 100° C. Vapor of n-octylisocyanate was delivered to the chamber from a source vessel heated to 70° C. and let soak for 5 minutes. The chamber was again evacuated. Without exposing the substrate to air, cyclic atomic layer deposition of titanium oxide was conducted in the presence of the substrate by alternating exposures of tetrakis(dimethylamino)titanium followed by purging and then water vapor followed by purging. The deposition thickness on the silicon oxide portions of the substrate is greater than that on the silicon nitride portions of the substrate.

Comparative example 2: A 300 mm diameter silicon wafer (the substrate) having a patterned surface containing both silicon nitride and silicon oxide features was dipped into a bath containing aqueous 1% hydrofluoric acid solution (0.3 moles/L) for 60 seconds and then rinsed with de-aerated DI water and dried under nitrogen gas. The wafer was transferred into a deposition chamber that was evacuated and heated to 100° C. Without exposing the substrate to air, cyclic atomic layer deposition of titanium oxide was conducted in the presence of the substrate by alternating exposures of tetrakis(dimethylamino)titanium followed by purging and then water vapor followed by purging. The deposition thickness on the silicon oxide portions of the substrate is essentially the same as that on the silicon nitride portions of the substrate.

Example 3: A 300 mm diameter silicon wafer (the substrate) having a patterned surface containing both silicon nitride and silicon oxide features was dipped into a bath containing aqueous 0.5% hydrofluoric acid solution (0.1 moles/L) for 30 seconds and then rinsed with de-aerated DI water and dried under nitrogen gas. The wafer was then dipped into a solution containing 10% by weight octadecylisocyanate dissolved in dry hexanes and let sit for 30 minutes. The wafer was then removed and rinsed with dry hexanes and dried under a flow of nitrogen. The wafer was transferred into a deposition chamber that was evacuated and heated to 100° C. Without exposing the substrate to air, cyclic atomic layer deposition of titanium oxide was conducted in the presence of the substrate by alternating exposures of tetrakis(dimethylamino)titanium followed by purging and then water vapor followed by purging. The deposition thickness on the silicon oxide portions of the substrate is greater than that on the silicon nitride portions of the substrate.

Example 4: A 300 mm diameter silicon wafer (the substrate) having a patterned surface containing both silicon nitride and silicon oxide features was dipped into a bath containing aqueous 0.5% hydrofluoric acid solution (0.1 moles/L) for 60 seconds and then rinsed with de-aerated DI water and dried under nitrogen gas. The wafer was transferred into a deposition chamber that was evacuated and heated to 100° C. Vapors of n-octylisocyanate are delivered to the chamber from a source vessel heated to 70° C. and let soak for 15 minutes. The chamber was again evacuated. Without exposing the substrate to air, cyclic atomic layer deposition of silicon oxide was conducted in the presence of the substrate by alternating exposures of disecbutylaminosilane vapors followed by purging and then 5% ozone in $O_2$ followed by purging. The deposition thickness on the silicon oxide portions of the substrate is greater than that on the silicon nitride portions of the substrate.

Example 5: A 300 mm diameter silicon wafer (the substrate) having a patterned surface containing both silicon nitride and silicon oxide features was dipped into a bath containing aqueous 0.2% hydrofluoric acid solution (0.06 moles/L) for 60 seconds and then rinsed with de-aerated DI water and dried under nitrogen gas. The wafer was transferred into a deposition chamber that was evacuated and heated to 100° C. Vapor of n-octylisocyanate was delivered to the chamber from a source vessel heated to 70° C. and let soak for 5 minutes. The chamber was again evacuated. Without exposing the substrate to air, cyclic atomic layer deposition of titanium oxide was conducted in the presence of the substrate by alternating exposures of tetrakis(dimethylamino)titanium followed by purging and then water vapor followed by purging and then n-octylisocyanate followed by purging. The deposition thickness on the silicon oxide portions of the substrate was greater than that on the silicon nitride portions of the substrate.

Example 6: A 300 mm diameter silicon wafer (the substrate) having a patterned surface containing both silicon nitride and cobalt features was dipped into a bath containing aqueous 1% hydrofluoric acid solution (0.3 moles/L) for 60 seconds and then rinsed with de-aerated DI water and dried under nitrogen gas. The wafer was transferred into a deposition chamber that was evacuated and heated to 100° C. Vapor of n-octylisocyanate was delivered to the chamber from a source vessel heated to 70° C. and let soak for 5 minutes. The chamber was again evacuated. Without exposing the substrate to air, cyclic atomic layer deposition of titanium oxide was conducted in the presence of the substrate by alternating exposures of tetrakis(dimethylamino) titanium followed by purging and then water vapor followed by purging. The deposition thickness on the cobalt portions of the substrate is greater than that on the silicon nitride portions of the substrate.

While the principles of the invention have been described above in connection with preferred embodiments, it is to be clearly understood that this description is made only by way of example and not as a limitation of the scope of the invention.

The invention claimed is:

1. A method for selectively passivating a surface of a substrate, wherein the surface of the substrate comprises at least a first surface comprising silicon nitride and at least a second surface comprising a material other than silicon nitride, the method comprising the steps of:
   a. treating the surface with hydrogen plasma or ammonia plasma; and
   b. exposing the surface to at least one organoisocyanate having a structure according to Formula I:

$$R-N=C=O \qquad (I),$$

wherein R is selected from the group consisting of H, a substituted or unsubstituted $C_1$ to $C_{18}$ linear alkyl group, a substituted or unsubstituted branched $C_3$ to $C_{18}$ alkyl group, a substituted or unsubstituted $C_3$ to $C_8$ cyclic alkyl group, a substituted or unsubstituted $C_3$ to $C_{10}$ heterocyclic group, a substituted or unsubstituted $C_3$ to $C_{18}$ alkenyl group, a substituted or unsubstituted $C_4$ to $C_{18}$ aryl group, a substituted or unsubstituted $C_5$ to $C_{20}$ arylalkyl group, and a substituted or unsubstituted $C_3$ to $C_{10}$ alkynyl group, wherein the at least one organoisocyanate selectively reacts with the silicon nitride to passivate the first surface thereby leaving the second surface substantially unreacted.

2. The method of claim 1, further comprising the following steps which are performed prior to steps a and b:
   contacting the surface of the substrate with a wet chemical composition;
   rinsing the surface with deionized water; and
   drying the surface,
   wherein the wet chemical composition comprises at least one selected from the group consisting of a composition comprising $H_2O_2$ (28% aq), $NH_4O_4$ (28-30%), and $H_2O$; HF (0.01%-5% (aq)); peroxide; RCA clean chemicals SC-1 and SC-2; and a mixture of $H_2SO_4/H_2O_2$.

3. The method of claim 1 wherein the second surface comprises at least one selected from the group consisting of $SiO_2$, a metal oxide, copper, cobalt, tungsten, amorphous silicon, polysilicon, monocrystalline silicon, germanium, and amorphous hydrogenated germanium.

4. The method of claim 3 wherein the second surface comprises $SiO_2$.

5. The method of claim 1 wherein the at least one organoisocyanate is a fluorine-substituted $C_1$ to $C_{18}$ linear alkyl group having a structure $C_nF_{2n+1}CH_2N=C=O$, wherein n is 1 to 17.

6. The method of claim 5 wherein the at least one organoisocyanate is selected from the group consisting of $CF_3CH_2N=C=O$, $C_2F_5CH_2N=C=O$, $C_3F_7CH_2N=C=O$, $C_4F_9CH_2N=C=O$, $C_5F_{11}CH_2N=C=O$, $C_6F_{13}CH_2N=C=O$, $C_7F_{15}CH_2N=C=O$, $C_8F_{17}CH_2N=C=O$, and $C_9F_{19}CH_2N=C=O$.

7. The method of claim 1 wherein R is a chlorine-substituted $C_1$ to $C_{18}$ linear alkyl group having a structure $C_nCl_{2n+1}CH_2N=C=O$, wherein n is 1 to 17.

8. The method of claim 7 wherein the at least one organoisocyanate is selected from the group consisting of $CCl_3CH_2N=C=O$, $C_2Cl_5CH_2N=C=O$, $C_3Cl_7CH_2N=C=O$, $C_4Cl_9CH_2N=C=O$, $C_5Cl_{11}CH_2N=C=O$, $C_6Cl_{13}CH_2N=C=O$, $C_7Cl_{15}CH_2N=C=O$, $C_8Cl_{17}CH_2N=C=O$, and $C_9Cl_{19}CH_2N=C=O$.

9. The method of claim 1 wherein R is a substituted or unsubstituted $C_3$ to $C_8$ cyclic alkyl group.

10. The method of claim 9 wherein the at least one organoisocyanate is selected from the group consisting of cyclopropyl isocyanate, cyclobutyl isocyanate, cyclohexyl isocyanate, and methylcyclohexyl isocyanate.

11. The method of claim 1 wherein R is a substituted or unsubstituted $C_4$ to $C_{18}$ aryl group.

12. The method of claim 11 wherein the at least one organoisocyanate is selected from the group consisting of phenyl isocyanate, tolyl isocyanate, dimethylphenyl isocyanate, naphthyl isocyanate, 2-ethylphenylisocyanate, and xylyl isocyanate.

13. The method of claim 1 wherein R is an unsubstituted $C_1$ to $C_{18}$ linear alkyl group or R is a substituted or unsubstituted branched $C_3$ to $C_{18}$ alkyl group.

14. The method of claim 13 wherein the at least one organoisocyanate is selected from the group consisting of methyl isocyanate, ethyl isocyanate, propyl isocyanate, isopropyl isocyanate, n-butyl isocyanate, sec-butyl isocyanate, tert-butyl isocyanate, pentyl isocyanate, hexyl isocyanate, octyl isocyanate, decyl isocyanate, dodecyl isocyanate, stearyl isocyanate, 1,1,3,3-tetramethylbutylisocyanate, and 1-methylheptylisocyanate.

15. The method of claim 1 wherein R is a substituted or unsubstituted $C_5$ to $C_{20}$ arylalkyl group.

16. The method of claim 15 wherein the at least one organoisocyanate is benzyl isocyanate.

17. The method of claim 1 wherein the exposing step is conducted with a vapor of the at least one organoisocyanate.

18. A method of selectively depositing a film on a surface of a substrate wherein the surface of the substrate comprises at least a first surface comprising silicon nitride and at least a second surface comprising a material other than silicon nitride, the method comprising the steps of:
a. treating the surface with hydrogen plasma or ammonia plasma;
b. exposing the surface to at least one organoisocyanate having a structure according to Formula I:

$$R-N=C=O \quad (I),$$

wherein, R is selected from the group consisting of H, a substituted or unsubstituted $C_1$ to $C_{18}$ linear alkyl group, a substituted or unsubstituted branched $C_3$ to $C_{18}$ alkyl group, a substituted or unsubstituted $C_3$ to $C_8$ cyclic alkyl group, a substituted or unsubstituted $C_3$ to $C_{10}$ heterocyclic group, a substituted or unsubstituted $C_3$ to $C_{18}$ alkenyl group, a substituted or unsubstituted $C_4$ to $C_{18}$ aryl group, a substituted or unsubstituted $C_5$ to $C_{20}$ arylalkyl group, and a substituted or unsubstituted $C_3$ to $C_{10}$ alkynyl group, wherein the at least one organoisocyanate selectively reacts with the silicon nitride to passivate the first surface thereby leaving the second surface substantially unreacted; and
c. exposing the surface of the substrate to one or more deposition precursors to deposit a film on the second surface selectively over the first surface.

19. The method of claim 18 further comprising the following steps which are performed prior to steps a and b and c:
contacting the surface of the substrate with a wet chemical composition;
rinsing the surface with deionized water; and
drying the surface, wherein the wet chemical composition comprises at least one selected from the group consisting of a composition comprising $H_2O_2$ (28% aq), $NH_4O_4$ (28-30%), and $H_2O$; HF (0.01%-5% (aq)); peroxide; RCA clean chemicals SC-1 and SC-2; and a mixture of $H_2SO_4/H_2O_2$.

20. The method of claim 18 wherein the second surface comprises at least one selected from the group consisting of $SiO_2$, a metal oxide, copper, cobalt, tungsten, amorphous silicon, polysilicon, monocrystalline silicon, germanium, and amorphous hydrogenated germanium.

21. The method of claim 20 wherein the second surface comprises $SiO_2$.

22. The method of claim 18 wherein the at least one organoisocyanate is a fluorine-substituted $C_1$ to $C_{18}$ linear alkyl group having a structure $C_nF_{2n+1}CH_2N=C=O$, wherein n is 1 to 17.

23. The method of claim 22 wherein the at least one organoisocyanate is selected from the group consisting of $CF_3CH_2N=C=O$, $C_2F_5CH_2N=C=O$, $C_3F_7CH_2N=C=O$, $C_4F_9CH_2N=C=O$, $C_5F_{11}CH_2N=C=O$, $C_6F_{13}CH_2N=C=O$, $C_7F_{15}CH_2N=C=O$, $C_8F_{17}CH_2N=C=O$, and $C_9F_{19}CH_2N=C=O$.

24. The method of claim 18 wherein R is a chlorine-substituted $C_1$ to $C_{18}$ linear alkyl group having a structure $C_nCl_{2n+1}CH_2N=C=O$, wherein n is 1 to 17.

25. The method of claim 24 wherein the at least one organoisocyanate is selected from the group consisting of $CCl_3CH_2N=C=O$, $C_2Cl_5CH_2N=C=O$, $C_3Cl_7CH_2N=C=O$, $C_4Cl_9CH_2N=C=O$, $C_5Cl_{11}CH_2N=C=O$, $C_6Cl_{13}CH_2N=C=O$, $C_7Cl_{15}CH_2N=C=O$, $C_8Cl_{17}CH_2N=C=O$, and $C_9Cl_{19}CH_2N=C=O$.

26. The method of claim 18 wherein R is a substituted or unsubstituted $C_3$ to $C_8$ cyclic alkyl group.

27. The method of claim 26 wherein the at least one organoisocyanate is selected from the group consisting of cyclopropyl isocyanate, cyclobutyl isocyanate, cyclohexyl isocyanate, and methylcyclohexyl isocyanate.

28. The method of claim 18 wherein R is a substituted or unsubstituted $C_4$ to $C_{18}$ aryl group.

29. The method of claim 28 wherein the at least one organoisocyanate is selected from the group consisting of phenyl isocyanate, tolyl isocyanate, dimethylphenyl isocyanate, naphthyl isocyanate, 2-ethylphenylisocyanate, and xylyl isocyanate.

30. The method of claim 18 wherein R is an unsubstituted $C_1$ to $C_{18}$ linear alkyl group or R is a substituted or unsubstituted branched $C_3$ to $C_{18}$ alkyl group.

31. The method of claim 30 wherein the at least one organoisocyanate is selected from the group consisting of methyl isocyanate, ethyl isocyanate, propyl isocyanate, isopropyl isocyanate, n-butyl isocyanate, sec-butyl isocyanate, tert-butyl isocyanate, pentyl isocyanate, hexyl isocyanate, octyl isocyanate, decyl isocyanate, dodecyl isocyanate, stearyl isocyanate, 1,1,3,3-tetramethylbutylisocyanate, and 1-methylheptylisocyanate.

32. The method of claim 18 wherein R is a substituted or unsubstituted $C_5$ to $C_{20}$ arylalkyl group.

33. The method of claim 32 wherein the at least one organoisocyanate is benzyl isocyanate.

34. The method of claim 18 wherein the exposing step is conducted with a vapor of the at least one organoisocyanate.

* * * * *